United States Patent [19]

Vazquez

[11] Patent Number: 5,424,630
[45] Date of Patent: Jun. 13, 1995

[54] CIRCUIT TEST DEVICE FOR DETECTING THE PRESENCE OF AN ELECTRIC CURRENT IN A CONDUCTOR

[76] Inventor: Eduardo Vazquez, 2005 San Souci Blvd., Apt. 101, North Miami, Fla. 33181

[21] Appl. No.: 129,316
[22] Filed: Sep. 30, 1993
[51] Int. Cl.⁶ .................. G01R 19/145; G01R 31/02
[52] U.S. Cl. .................. 324/72.5; 324/133; 324/149; 324/556; 439/482
[58] Field of Search ............. 324/503, 505, 506, 509, 324/537, 543, 544, 555, 556, 158 P, 133, 149, 72.5, 754; 340/650, 652; 439/401, 482, 392, 912

[56] References Cited

U.S. PATENT DOCUMENTS

| | | | |
|---|---|---|---|
| 1,986,414 | 1/1935 | Saunders | 324/556 |
| 4,039,240 | 8/1977 | Peterson | 439/401 |
| 4,361,800 | 11/1982 | Fodali et al. | 324/72.5 |
| 4,584,526 | 4/1986 | Lobastov | 324/133 |
| 4,618,821 | 10/1986 | Lenz | 324/754 |

Primary Examiner—Kenneth A. Wieder
Assistant Examiner—Diep Do
Attorney, Agent, or Firm—Robert M. Downey

[57] ABSTRACT

A device for detecting the presence of an electric current in a conductor having a elongate hollow tubular body defining a handle, an electrically conductive blade having a sharpened edge attached to and extending from one end of the handle, an electric lamp visibly housed within the handle and electrically connected to the blade and a ground wire electrically connected to the lamp and including a clamp for secured attachment to a ground. The sharpened edge of the blade is specifically structured and disposed for cutting through the insulation of a wire conductor for conductive contact therewith whereupon the presence of an electric current through the conductor will illuminate the lamp in the handle of the device.

7 Claims, 1 Drawing Sheet

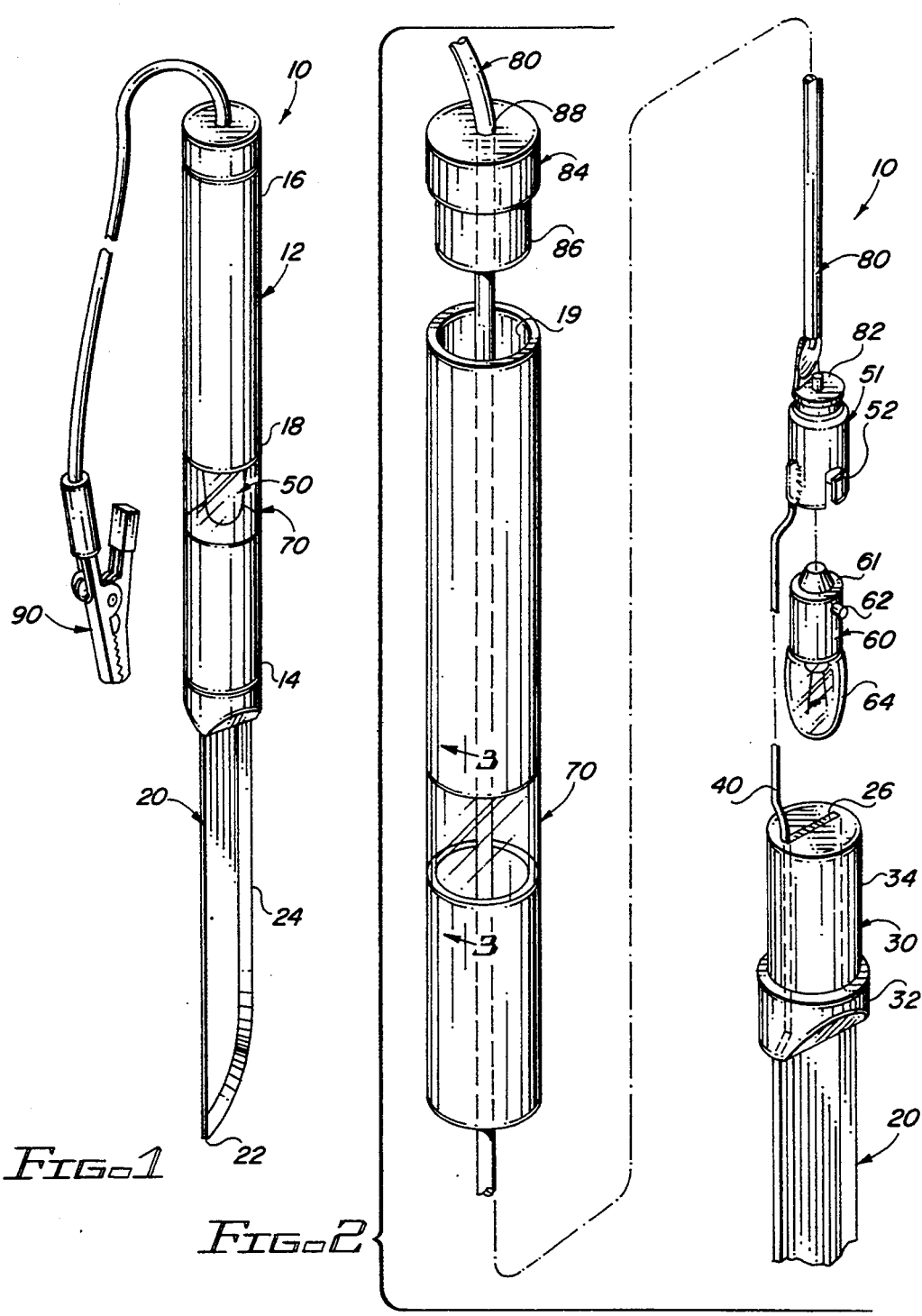
Fig. 1
Fig. 2
Fig. 3
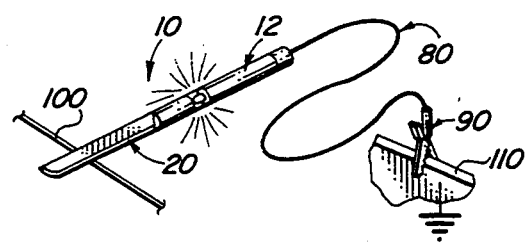
Fig. 4
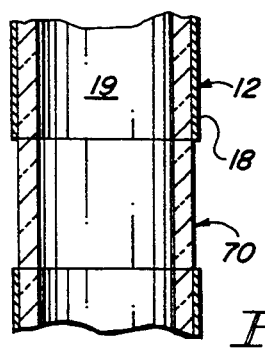

CIRCUIT TEST DEVICE FOR DETECTING THE PRESENCE OF AN ELECTRIC CURRENT IN A CONDUCTOR

BACKGROUND OF THE INVENTION

1. Field of the Invention

The present invention relates to electric current detecting devices or circuit testers of the type adapted to penetrate an insulative coating of an electrical conductor for electric contact with the conductor whereupon the presence of an electric current is detected and indicated.

2. Description of the Related Art

Numerous circuit testing devices are known in the related art for detecting the existence of an electric current in a conductor or for measuring the voltage of the current. Most of these devices include an electrically conductive pointed probe which is specifically structured to pierce the insulative coating about a wire, thus eliminating the necessity of having to strip or otherwise remove the insulation prior to testing the wire. Many of the circuit testing devices in the related art include signal lights which are electrically interconnected with the conductive pointed probe. In this manner, once the probe comes into contact with the wire conductor within the coated insulation, any current flowing through the conductor will cause the signal light to be activated, thus indicating to the operator the presence of current through the conductor.

A common problem associated with the use of these pointed probe circuit testing devices is encountered when attempting to pierce the probe tip through the insulative coating of a wire. Ordinarily, in order to pierce the insulation, the operator must hold the wire with one hand while attempting to poke the pointed tip of the probe through the insulation. These type of testing devices are intended for use with low voltage conductors, and therefore, most of the wires tested are relatively thin making it even more difficult to pierce the insulation. In most instances, the operator of these type of pointed probe devices will have to make several attempts as the pointed tip often slips off or misses the wire, possibly resulting in injury to the operator should the pointed tip hit and puncture the operator's hand holding the wire. This is especially true when working in dark confined spaces wherein the ability of the operator to see and manipulate the probe tip relative to the wire being tested is restricted.

While the circuit testers as described above have been found to be generally useful for their intended purpose, the danger resulting from the difficulty of using the pointed probes presents an ongoing problem, especially to those operators whose occupation requires extensive use of these devices.

SUMMARY OF THE INVENTION

The present invention is directed to a circuit testing device for detecting the presence of an electric current in a conductor. The device includes an elongate hollow tubular body defining a handle. The handle includes a first end, an opposite second end and a central zone therebetween. An electrically conductive element, resembling a knife blade, includes an elongate sharpened edge and a free distal tip. The conductive element is connected to and extends from the first end of the handle such that the elongate sharpened edge and distal tip are fully exposed.

A current indicator means, such as a light bulb, is housed within the handle and electrically interconnected with the conductive element. A ground wire connects at one end to the current indicator and extends from the second end of the handle terminating at a free distal end to which an alligator type clamp is electrically attached.

In use, the alligator type ground clamp is first secured to a suitable type ground. The sharpened edge of the conductive element is then gently moved against the insulative coating of a wire to be tested applying slight pressure causing the sharpened edge to cut through the insulation and come into electrical contact with the conductor therein. Any current flow through the conductor is directed through the conductive element to the current indicator means, causing activation thereof, and thus indicating the presence of a current in the conductor. Failure of the current indicator means to activate indicates the absence of current flow in the conductor.

While the present invention is ideally suited for detecting the presence of current through insulated wires, it may be further used to test diodes, fuses, light bulbs, short circuits, switch contacts and high resistance connections. The device can further be used for circuit tracing and testing continuity and polarity. When used in the automobile repair industry the device is further useful in checking for current to starters, relays, injectors, compressors and sensors.

With the foregoing in mind, it is a primary object of the present invention to provide an improved current indicator device for detecting the presence of an electric current in a conductor wherein the device includes means to quickly and easily penetrate the insulation of a wire being tested without the need to poke or probe.

It is a further object of the present invention to provide a circuit testing device for detecting the presence of an electric current in a conductor having improved wire insulation penetrating means including an electrically conductive element having an elongate sharpened edge.

It is still a further object of the present invention to provide an improved circuit testing device for detecting the presence of an electric current in a conductor which is specifically adapted to quickly and easily penetrate the insulation of wires, substantially reducing the risk of injury to the user.

These and other objects and advantages of the present invention will be more readily apparent in the description which follows.

BRIEF DESCRIPTION OF THE DRAWINGS

For a fuller understanding of the nature of the present invention, reference should be had to the following detailed description taken in connection with the accompanying drawings in which:

FIG. 1 is a perspective view of the circuit testing device of the present invention;

FIG. 2 is an exploded view, shown in perspective, illustrating electrical interconnection of a ground conductor and conductive element to a current indicator means of the device;

FIG. 3 is an isolated sectional view taken along line 3—3 of FIG. 2; and

FIG. 4 is a perspective view illustrating use of the device.

Like reference numerals refer to like parts throughout the several views of the drawings.

DETAILED DESCRIPTION OF THE PREFERRED EMBODIMENT

With reference to FIGS. 1-4 of the drawings, there is illustrated the circuit testing device, generally indicated as 10, for detecting the presence of an electric current in a conductor. The testing device 10 includes an elongate hollow tubular body defining a handle 12 having a first end 14, an opposite end 16 and a central zone 18 therebetween. The hollow handle 12 further includes a hollow interior cavity 19 extending between opposite ends 14, 16. An electrically conductive element, preferably formed of a high strength metal having excellent conductive properties, is attached to and extends from the first end 14 of the handle 12. The conductive element 20 may resemble a knife blade and includes a distal tip 22 and a sharpened edge 24 extending from the distal tip 22 to the end of the handle 14.

Attachment means are provided for secured attachment of the conductive element 20 to the handle and includes a plug 30 having an enlarged head portion 32 and a stem 34 adapted for snug, fitted receipt within the hollow interior of the handle 12 through open end 14. An end zone 26 of the conductive element 20 is captured and fixedly held within the plug 30, preventing removal therefrom. Thus, fitted receipt of the stem 34 within the handle serves to attach the conductive element 20 to the end 14 thereof.

A wire 40 is electrically interconnected at opposite ends between the end zone 26 of the conductive element 20 and an indicator means 50. In the preferred embodiment shown in FIG. 2, the indicator means comprises a lamp means including a bayonet type socket 51 having an open end 52 adapted for receipt of a lamp 60 therein. The socket 51 further includes a groove 54 for locking receipt of a protruding knob 62 extending outwardly from an electrically conductive collar 61 of the lamp 60. The lamp further includes a bulb portion 64 adapted to emit light therefrom upon current flow to the collar 61 thereof. As seen in FIG. 2, the wire 40 connects at one to the socket 51 which is formed of an electrically conductive material such that a current flow from the conductive element 20 is directed to the socket 51 and accordingly the lamp 60 fitted therein so as to illuminate the bulb 64. A window 70 is provided along the central 18 of the handle 12, preferably extending completely thereabout, so as to visibly expose the lamp 60.

A ground conductor 80 attaches to a bottom of the socket 51 with a connector element 82. The ground conductor 80 extends out from within the handle 12 through a cap 84 fitted in covering relation to the open end 16. The cap 84 includes a reduced diameter zone 86 adapted for snug fitted receipt within the open end 16. An aperture 88 extends through the cap 84 for passage of the ground conductor 80 therethrough. An alligator type clip 90 is fitted to an opposite end of the ground conductor 80 for attachment to a suitable ground.

The device is very simple to use, as illustrated in FIG. 4. First, the alligator ground clamp 90 is secured to a suitable ground 110. Next, holding the handle 12 with one hand, the sharpened edge 24 of the conductive element 20 is caused to come in contact with the outer insulation of a conductor 100 to be tested. By applying slight pressure and moving the sharpened edge 24 relative to the insulation, in a slicing motion, the conductive element 20 penetrates through the insulative coating and is caused to come in contact with the conductor encapsulated therein. A current in the conductor 100 will be directed through the conductive element 20 to the current indicator means 50, causing the bulb 64 to be illuminated, thus indicating that there are no breaks or shorts in the conductor 100 between two reference points.

Now that the invention has been described,
What is claimed is:

1. A circuit testing device for detecting the presence of an electric current in a conductor comprising:
   an elongate hollow body defining a handle and including a first end, an opposite second end and a central zone,
   an electrically conductive element secured to and extending from said first end of said handle,
   said electrically conductive element including opposite flat faces, a proximal end zone disposed within said handle and a distal pointed tip and a sharpened elongate edge disposed exteriorly of said handle,
   attachment means for attaching said electrically conductive element to said first end of said handle,
   current indicator means within said handle,
   wire means electrically connecting said conductive element to said current indicator means,
   a ground conductor extending through said second end of said handle and including a fixed end electrically connected to said current indicator means, and a free end disposed exteriorly of said handle, and
   ground clamp means electrically connected to said free end of said ground conductor for attachment to an electrical ground.

2. The circuit testing device as set forth in claim 1 wherein said indicator means includes lamp means.

3. The circuit testing device as set forth in claim 2 wherein said lamp means includes an electrically activated lamp.

4. The circuit testing device as set forth in claim 3 wherein said lamp means further includes a socket structured for secured receipt of said lamp in electrically conductive relation therein, said socket being electrically connected to said wire means and said ground conductor.

5. The circuit testing device as set forth in claim 4 wherein said central zone of said handle includes window means for visibly exposing said lamp.

6. The circuit testing device as set forth in claim 1 wherein said elongate sharpened edge of said conductive element is at least 1 inch in length 7. The circuit testing device as set forth in claim 1 wherein said conductive element is defined by a blade.

* * * * *